United States Patent [19]

Sakai et al.

[11] Patent Number: 5,170,238

[45] Date of Patent: Dec. 8, 1992

[54] SWITCHING ELEMENT WITH ORGANIC INSULATIVE REGION

[75] Inventors: Kunihiro Sakai, Isehara; Haruki Kawada, Yokohama; Hiroshi Matsuda, Isehara; Kiyoshi Takimoto, Kawasaki; Hisaaki Kawade, Atsugi; Yuko Morikawa, Kawasaki; Ken Eguchi, Yokohama, all of Japan

[73] Assignee: Canon Kabushiki Kaisha, Tokyo, Japan

[21] Appl. No.: 313,499

[22] Filed: Feb. 22, 1989

[30] Foreign Application Priority Data

Feb. 22, 1988 [JP] Japan .................................. 63-39829

[51] Int. Cl.⁵ ............................................. H01L 27/14
[52] U.S. Cl. .................................... 307/311; 365/153; 257/40
[58] Field of Search .............. 357/8, 30 R, 30 P, 30 I, 357/8, 30 K, 2, 30 B, 51; 365/127, 153, 30 R, 30 B, 30 P, 51; 361/173

[56] References Cited

U.S. PATENT DOCUMENTS 3,833,894  9/1974  Aviram et al. ..................... 357/8 X
4,731,756  3/1988  Potember et al. .............. 365/127 X
4,876,585 10/1989  Ozawa .......................... 357/30 P X
4,969,025 11/1990  Yamamoto et al. ................... 357/71

FOREIGN PATENT DOCUMENTS 0244835 11/1987  European Pat. Off. .
0268370  5/1988  European Pat. Off. .
0272937  6/1988  European Pat. Off. .

OTHER PUBLICATIONS

Thin Solid Films, vol. 149, No. 2, May 25, 1987, pp. 163-170, Y. L. Hua, et al: "photoelectric properties of substituted silicon phthalocyanine langmuir-blodgett film Schottky barrier and metal/insulator/semiconductor devices".

Electronics International, vol. 55, No. 15, Jul. 1982, pp. 47-48, R. Connolly: "Light, electric pulses switch organic films".

Applied Physics Letters, vol. 41, No. 6, Sep. 1982, pp. 548-550, R. S. Potember, et al.: "Optical switching in semiconductor organic thin films".

Primary Examiner—William Mintel
Assistant Examiner—Roy Potter
Attorney, Agent, or Firm—Fitzpatrick, Cella, Harper & Scinto

[57] ABSTRACT

A switching element is disclosed which comprises an element comprising two electrodes and an organic insulative region interposed between said two electrodes. The element has a memory property and is capable of being switched between different resistance states upon the application of a predetermined voltage. The switching element also comprises a photosensitive region which has an electrical property which is changed by irradiation of light. The photosensitive region is arranged to change a magnitude of voltage applied to the element. The switching device also comprises a means for applying a biasing voltage to the element and the photosensitive region. This biasing voltage is of such a magnitude as to initiate one of the resistance states in said element, having the memory property when light is irradiated on the photosensitive region.

21 Claims, 5 Drawing Sheets

SWITCHING ELEMENT WITH ORGANIC INSULATIVE REGION

BACKGROUND OF THE INVENTION

1. Field of the Invention

The present invention relates to a novel switching element which serves to switch an electrical circuit from an off state to an on state or from an on state to an off state and, in one aspect, achieves such switching when rays of light (such as visible rays, ultraviolet rays, infrared rays and so on) are applied thereto.

2. Description of the Prior Art

Hitherto, photoconductive cells in which an ohmic contact electrode is provided on a photoconductor such as CdS, ZnO or the like, as well as optical switch diodes having p-n-p-n junctions, have been conventionally used in a wide range of fields as photoelectric conversion devices which serve to switch electrical circuits from an off state to an on state when light or an optical pulse is applied thereto. These photoconductive cells, however, have a disadvantage in that the switching speed they operate at is as low as about 100 msec. On the other hand, p-n-p-n optical switch diodes which perform on-off actions by utilizing the photoelectromotive force that is produced when light is applied to a p-n junction of a semiconductor exhibit a switching speed of 0.05 to 0.10 μsec.

In these conventional elements, however, current continuously flows through them owing to their self-holding function once they have been turned on even if the irradiation of light is stopped. It is necessary, if a return to the off state is desired, to reduce the circuit current by changing certain external conditions.

Other optical switching elements having a semiconductor hetero-structure superlattice have been recently formed on an experimental basis, in which different types of semiconductors are laminated in alternate layers to provide a long-period structure (D. A. B. Millers, IEEE Journal of Quantum Electronics, QE-21, 1462 (1985)). Such optical switching elements are capable of rapidly switching electrical circuits in response to the application and removal of radiation. Materials used for forming the above-described type of semiconductor hetero-structure superlattice are, however, limited to such inorganic materials as GaAs, Si and the like, and the formation of such a superlattice requires a complicated process. No optical switching elements made of organic materials have been so far reported.

SUMMARY OF THE INVENTION

Accordingly, it is an object of the present invention to provide a novel optical switching element formed from, for example, organic materials, and particularly to provide an optical switching element which utilizes a laminar structure comprising microfilms made of an organic material.

The inventors formed an element with a sandwich-like structure (referred to as "MIM structure" or "MIM element" from the structural viewpoint) in which a laminar structure comprising organic microfilms is held between conductive materials such as metals or the like. They then observed and measured various characteristics such as the physical properties of the materials, the electrical properties of the element and so on. In this way, the inventors discovered a completely new switching phenomenon whereby the transition from a low-resistance (on) state to a high-resistance (off) state or vice versa takes place during electrical conduction when a given threshold voltage is applied, and in which a given state can be maintained at a voltage below the threshold value.

This led to the achievement of a novel optical switching element having a memory function exhibiting excellent reliability by separately providing a photoelectric conversion region (a medium or an element having photoconductivity or photoelectromotive force) on the above-described element formed with MIM structure.

DETAILED DESCRIPTION OF THE PREFERRED EMBODIMENTS

Examples of materials that may be used for two electrodes that may be used in the present invention include metals such as An, Ag, Al, Pt, Ni, Pb, Zn, Sn and the like; alloys and laminations thereof; semiconductors such as Si (monocrystal silicon, polysilicon, amorphous silicon, graphite and silicides (nickel silicide and palladium silicide)), GaAs, GaP, ITO, NESA and the like; and laminations thereof. The two electrodes may be of the same material or may be different from each other. The use of a known technique of forming films for the purpose of forming these electrodes enables the object of the present invention to be satisfactorily achieved. When the insulating region of the element of the present invention is formed using an organic material, after the relevant organic insulating layer has been formed, each of the electrodes is preferably formed by a method capable of forming films at a temperature of 300° C. or lower, for example, by a vapor deposition method or a sputtering method.

Although the employment of the optical switching element of the present invention is necessarily accompanied by the irradiation thereof with a certain kind of radiation, e.g. visible light, it is not necessary for both of the electrodes to have complete transparency to such radiation, such as visible light. For example, an electrode made of a metal such as Au, Al or the like may be used so long as it is sufficiently thin. The thickness is preferably 2000Å or less, more preferably 1000Å or less.

Thin films having semiconductivity or insulating properties are formed between the electrodes. These thin films can be formed by utilizing vapor deposition or molecular beam epitaxy, as well as using an oxide film such as $SiO_2$ or $Al_2O_3$ or a nitride film such as $Si_3N_4$ in accordance with the structure of the relevant element.

One of such films is preferably a microfilm, i.e., the thickness thereof is preferably 1000Å or less, more preferably 500Å or less, most preferably between 100Å and 5Å. Since uniformity of the surface of each insulating thin film and in the direction of the thickness thereof has a significant effect on the characteristics of the element and the stability thereof, adequate attention should be given to ensuring the uniformity.

An example of an optimum method of forming films that may be used in a preferred embodiment of the present invention is the Langmuir-Blodgett method.

This LB method is capable of easily forming monomolecular films of organic compounds having both hydrophobic and hydrophilic sites or accumulated films thereof on any desired electrode or any desired substrate containing any desired electrode, as well as stably supplying uniform and homogeneous organic microfilms each having a thickness of the order of a molecular length over a large area.

The LB method is a method which is capable of forming monomolecular films or accumulated films thereof on the basis of the fact that, when the balance (balance of amphipathic property) between a hydrophilic site and a hydrophobic site is appropriately maintained in a molecular structure having a hydrophilic site and hydrophobic site, molecules are arranged in such a manner that their hydrophilic groups face a water surface to form a monomolecular layer.

Examples of groups that form hydrophobic sites include various types of hydrophobic groups such as saturated and unsaturated hydrocarbon groups, condensed polycyclic aromatic groups, chain polycyclic phenyl groups and the like which are all generally and widely known. A hydrophobic site comprises one of these groups or a combination of a plurality of them. On the other hand, typical examples of elements that may form hydrophilic sites include hydrophilic groups such as carboxyl groups, ester groups, acid amide groups, imide groups, hydroxyl groups, sulfonyl groups, phosphate groups, amino groups (primary, secondary, tertiary and quaternary) and the like.

If each of the molecules has both the hydrophilic and hydrophobic groups in a well-balanced manner, it is possible to form a monomolecular film on a water surface. Since such molecules generally form an insulating monomolecular film and thus an accumulated monomolecular film which also exhibits insulating properties, they are very suitable materials for use in the present invention. Examples of such molecules are described below.

(1) Molecules Having π-Electron Level

Dyes each having a porphyrin skeleton such as phthalocyanine, tetraphenylporphyrin or the like; azulene dyes and two nitrogen-containing heterocycles such as quinoline, benzthiazole, benzoxazole or the like, each of which have as a bonding chain a squalilium group or a croconic methine group; cyanine-like dyes and cyanine dyes each having as a bonding group a squalilium group or a croconic methine group; condensed polycyclic aromatic compounds such as anthracene, pyrene and the like; and chain compounds obtained by condensation of aromatic cyclic compounds or heterocyclic compounds.

(2) Polymer Compounds

Polyimide derivatives, polyamic acid derivatives, polyamide derivatives, various fumaric acid copolymers, various maleic acid copolymers, polyacrylic acid derivatives, various acrylic acid copolymers, polydiacetylene derivatives, various vinyl compounds, synthetic polypeptides, and biological polymer compounds such as bacteriolodo pusine and cytochrome C.

(3) Fatty Acids

Carboxylic acids and carboxylates each having a long chain alkyl group and fluorine substitution products thereof; esters and sulfonates each having at least one long chain alkyl group and salts thereof; and phosphonic acid, salts thereof and fluorine substitution products thereof.

Particularly, polymer compounds and macrocyclic compounds such as phthalocyanine and the like among these compounds are preferably used from the viewpoint of their heat resistance. The use of any one of polymer materials such as polyimides, polyacrylic acids, various fumaric acid copolymers or various maleic acid copolymers exhibits excellent heat resistance, as well as enabling the thickness of one layer to be reduced to about 5Å.

As a matter of course, any other materials except for the above-described materials which are suitable for the LB method may be preferably used in the present invention.

The amphipathic molecules are arranged in such a manner that their hydrophilic groups face a water surface to form a monomolecular layer. In this case, the monomolecular layer formed on the water surface has the characteristics of a two-dimensional system, and, if the molecules are sparsely dispersed, the equation of state of a two-dimensional ideal gas:

$$\pi A = k T$$

(wherein k denotes the Boltzmann's constant and T denotes an absolute temperature) is established between the area A per molecule and the surface pressure $\pi$. The monomolecular layer formed is therefore considered as a "gaseous film". If the value of A is sufficiently reduced, the intermolecular interaction is increased to form a two-dimensional solid "condensed film" (or "solid film"). Such a condensed film can be transferred to the surface of any one of bodies having various shapes and made of various materials such as glass, resin or a metal. The monomolecular film formed by this method or a film obtained by accumulating such films can be used in an insulating region, i.e., as a potential barrier layer, for the optical switching element of the present invention.

An example of the method of forming such films is described in detail below.

Figure 5:
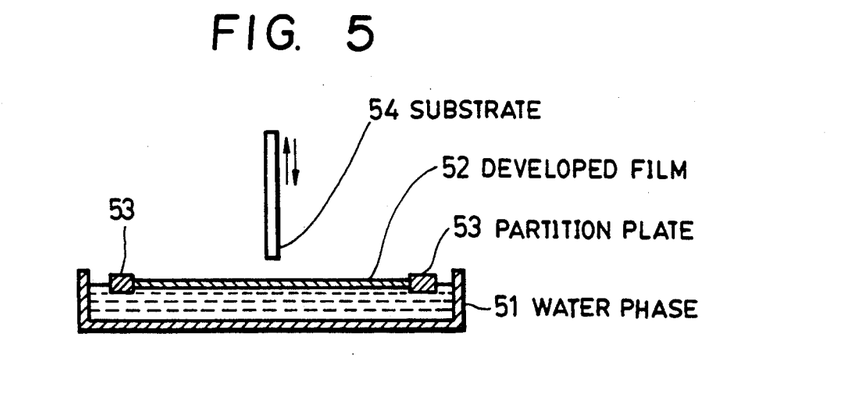
FIG. 5 is a diagrammatic representation which illustrates a method of forming the microfilm structure of the present invention using the LB method.

A desired organic compound is dissolved in a solvent such as chloroform, benzene, acetonitrile or the like. The thus-formed solution is then developed on a water phase 51 using such an appropriate apparatus as shown in FIG. 5 to form the organic compound into a film.

Figure 6A:
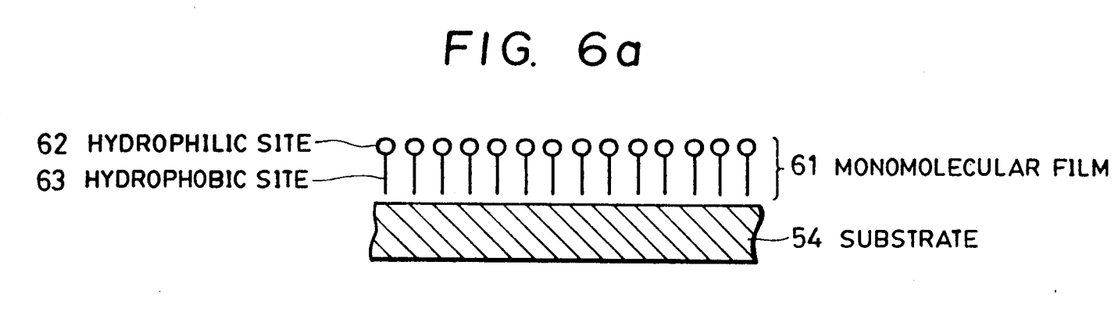
FIGS. 6(a) and 6(b) are schematic diagrams of monomolecular films.

Partition plates 53 (floats) are then provided on the water phase 51 for the purpose of preventing the developed layer 52 from freely diffusing and excessively extending so that the development area of the developed layer 52 is limited and the state of aggregation of the substances that form the film is controlled, the surface pressure $\pi$ in proportion to the state of aggregation thereby being obtained. The surface pressure $\pi$ can be set to a value suitable for forming the film by controlling the state of aggregation of the substances of the film by reducing the development area while moving the partition plates 53 so that the surface pressure is gradually increased. A monomolecular film of the organic compound can be transferred onto a clean substrate 54 by gently moving the substrate 54 upward or downward in the vertical direction while maintaining that surface pressure. The thus-formed monomolecular film 61 is a film in which the molecules are orderly arranged as schematically shown in FIG. 6a or 6b.

Although the monomolecular film 61 is formed by the above-described method, an accumulated film of a desired cumulative number can be formed by repeating the aforementioned process. The monomolecular film 61 can be transferred onto the substrate 54 by the above-described vertical immersion method, as well as other methods such as a horizontal adhesion method, a cylinder rotation method and the like.

The horizontal adhesion method is one in which a substrate is brought into contact with a water surface in the horizontal direction to transfer the monomolecular film onto the substrate. The cylinder rotation method is one in which a cylindrical substrate is rotated on a water surface to transfer the monomolecular film 61 onto the surface of the substrate.

Figure 6B:
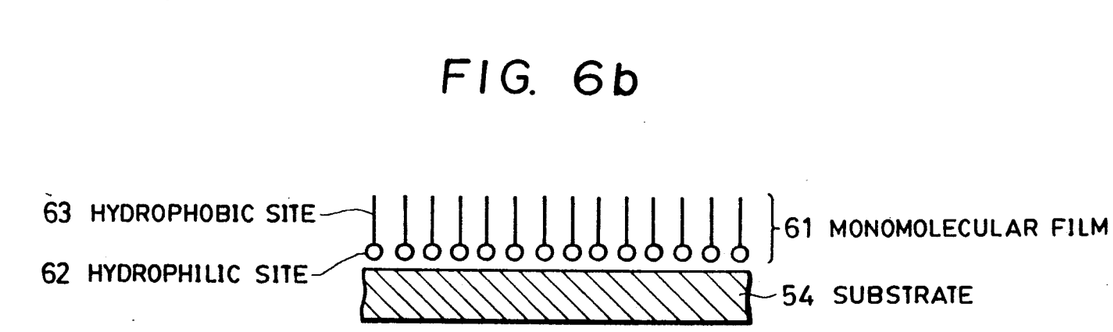
Figure 7A:
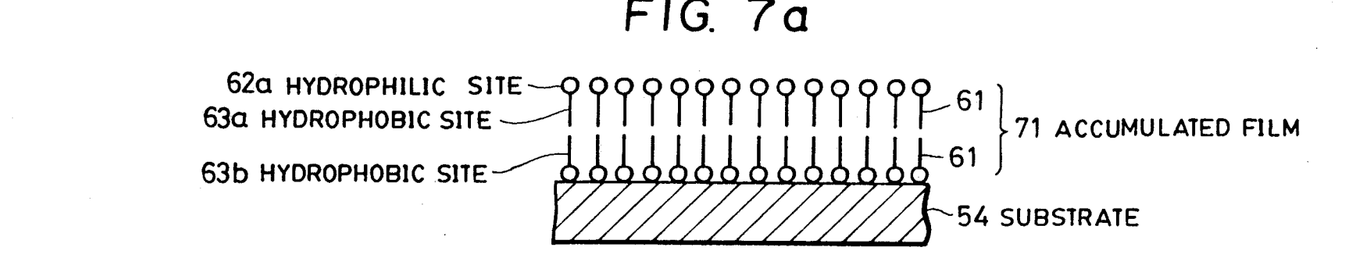
FIGS. 7(a), 7(b) and 7(c) are schematic diagrams of accumulated films.
Figure 7B:
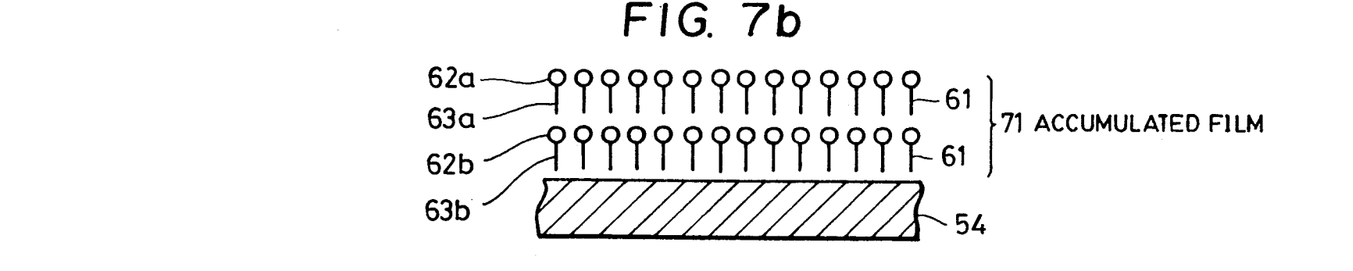
Figure 7C:
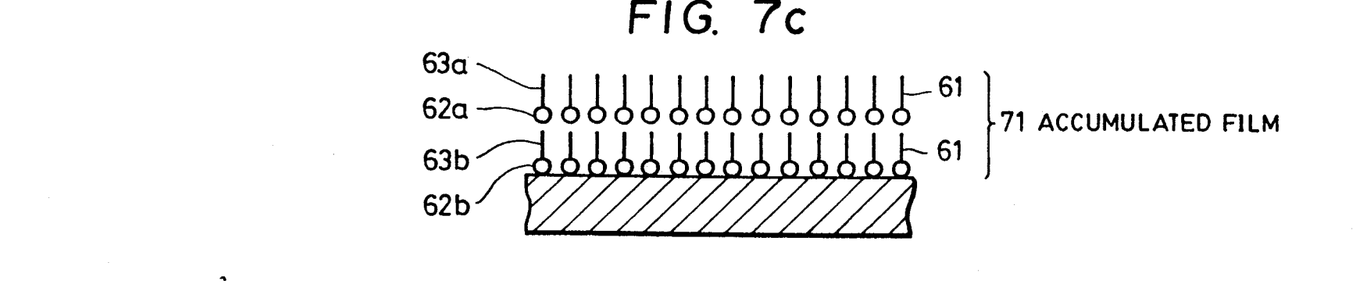

In the vertical immersion method, the substrate 54 having a hydrophilic surface is pulled upward from water in the direction vertical to the water surface to form on the substrate 54 the monomolecular film 61 composed of an organic compound in which the hydrophilic sites 62 of the molecules of the organic compound face the substrate 54 (FIG. 6b). A plurality of monomolecular films 61 are placed one on the other during each process in which the substrate 54 is moved upward or downward, as described above, to form an accumulated film 71. In this method, since the orientation of the molecules of the film formed by each pulling-up process is reverse to the orientation of the molecules of the film formed by each immersing process, a Y-type film in which the hydrophobic sites 63a, 63b of the organic compound face each other is formed between the respective monomolecular films 61 (FIG. 7a). On the other hand, the horizontal adhesion method enables the monomolecular film in which the hydrophobic sites 63 of the organic compound face the substrate 54 to be formed on the substrate 54 (FIG. 6a). In this method, if a plurality of monomolecular films 61 are accumulated, the orientations of the molecules of all the films are the same, resulting in the formation of an X-type film in which the hydrophobic sites 63b face to the substrate 54 in each layer (FIG. 7b). An accumulated film 71 in which the hydrophilic sites 62b face to the substrate in each layer is called a Z-type film (FIG. 7c).

The method of transferring the monomolecular film is not limited to the above-described method, and a method in which a substrate is pushed out from a roll into the water phase can also be employed when a substrate with a large area is used. The aforementioned orientation of either of the hydrophilic sites or the hydrophobic sites with respect to the substrate is only a principle and can thus be changed by effecting appropriate surface treatment of the substrate.

In this way, a laminar structure composed of organic microfilms comprising the monomolecular films of the organic compound or films obtained by accumulating such films is formed on the substrate.

Figure 1:
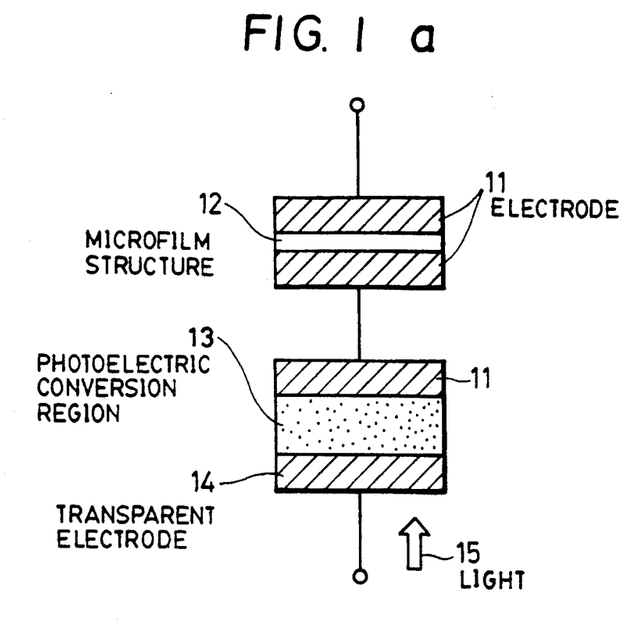
FIGS. 1(a), 1(b) and 1(c) are schematic drawings examples of the structure of an optical switching element according to the present invention.

A photoelectric conversion region is then formed in the vicinity of or in contact with the microfilm structure having semiconductivity or insulating properties which is held between the two electrodes. FIG. 1 schematically shows an example of the structure of an optical switching element. A region 13 is formed for the purpose of controlling the electronic state (electrical potential) of an MIM element (comprising electrodes 11 and a microfilm structure 12) by irradiation of light. In other words, the element is switched from an on state to an off state or vice versa by changing the dc bias applied to the microfilm structure 12 by about 0.1 to 2V using the electrical potential produced in the photoelectric conversion region 13 when light is applied thereto. This purpose can be specifically achieved by connecting a photoconductive or photoelectromotive force medium or element which is produced by a known method to the microfilm structure in series (FIG. 1a) or in parallel (FIG. 1b).

The above-described change in potential by 0.1 to 2V caused by irradiation of light can be easily attained by using a known photoconductive or photoelectromotive force-type semiconductor device or medium such as Si, Ge, PbS or CdS, exhibiting stable characteristics. As a matter of course, organic dye molecules and biological polymers may also be used in the photoelectric conversion region. Although FIG. 1 shows the case where the photoelectric conversion element has two terminals, a three-terminal element such as a phototransistor can also be connected. As shown in FIG. 1c, the microfilm structure 12 and the photoelectric conversion region 13 may be formed on the same substrate or in a continuous manner. An electrode which is transparent or semitransparent to light is used as an electrode 14 on the side of incidence in order to improve the efficiency of the application of light 15 to the photoelectric conversion region 13. The microfilm structure 12 is preferably formed by the above-described LB method.

On the other hand, the series connection or the parallel connection of the photoelectric conversion elements or medium 13 to the microfilm structure 12 is selected in accordance with the type of application of the switching element and the purpose thereof. Although the series connection exhibits a sufficiently low level of resistance (several to $100\Omega$) of the microfilm structure in the on state, it involves the problem that the resistance of the entire switching element in the on state is increased owing to the resistance value exhibited by the photoelectric conversion element. There is, however, no problem with respect to the resistance ($M\Omega$ to $G\Omega$) in the off state. On the other hand, the parallel connection reversely exhibits a resistance of the photoelectric conversion element which is not sufficiently high and thus involves the problem that the resistance in the off state is decreased. It is therefore desirable to select the series connection or the parallel connection in accordance with the purpose of decreasing the resistance in the on state or increasing the resistance in the off state.

The present invention is described in detail below with reference to several embodiments.

EXAMPLE 1

A sample (FIG. 2) having a structure comprising a lower transparent electrode 26, a photoconductive layer 25, an intermediate electrode 24, a microfilm structure 23 and an upper electrode 22 was formed in accordance with the procedure described below.. A glass substrate 28 (Uning #7059) having an upper surface covered with ITO ($In_2O_3 + SnO_3$) was used as a substrate or, in some cases, as the lower transparent electrode 26. An amorphous silicon film with a thickness of 2000Å was formed as the photoconductive layer 25 on the ITO on the substrate. In this example, the film formation was performed on the basis of a glow discharge method (the introduced gases, $SiH_4$, $H_2$; the rf (radio frequency) power, 0.01 $W/cm^2$; the pressure, 0.5 torr; the substrate temperature, 250° C.; accumulation speed, 40 Å/min).

Figure 2:
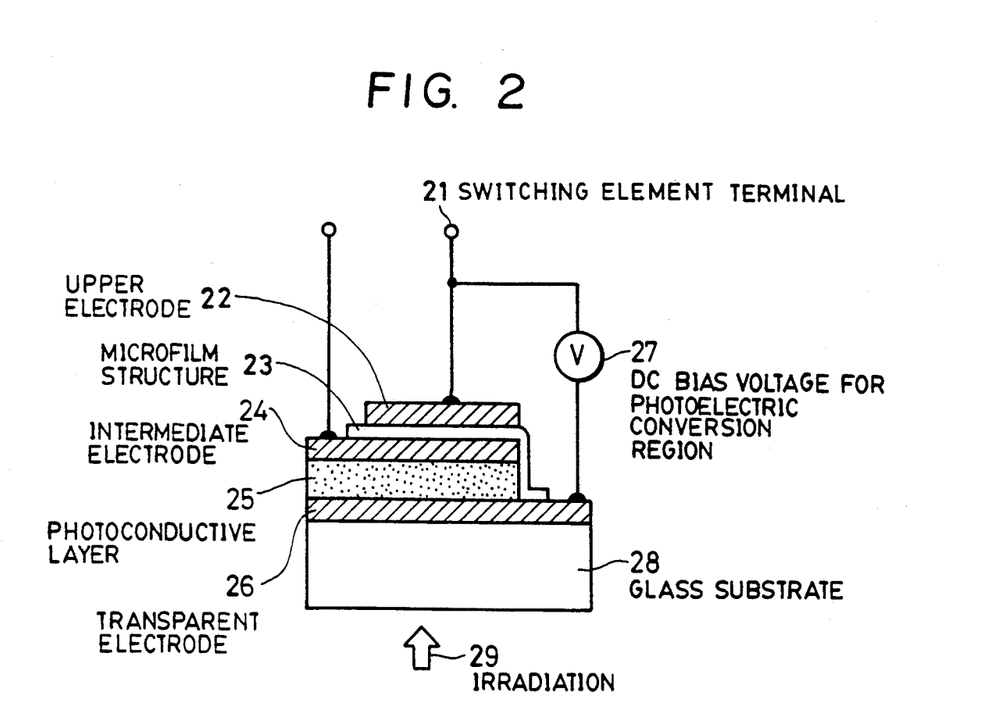
FIG. 2 is a block diagram of an optical switching element constituting an embodiment of the invention.

An Au strip (thickness, 400Å) having a width of 1 mm was then formed on the amorphous silicon film by vapor deposition to form the intermediate electrode 24. An accumulated film (thickness, about 35Å) comprising 10 polyimide monomolecular films was then formed on the sample by the LB method to form the microfilm structure 23. The method of forming the accumulated polyimide monomolecular films is described in detail below.

Polyamide acid (the concentration in terms of monomer, $1 \times 10^{3}M$) expressed by Formula (1) described below was dissolved in a mixed solvent containing N,N-dimethyl acetoamide and benzene (1:1 (V/V)). The thus-formed solution was then mixed with a $1 \times 10^{-3}M$ solution obtained by dissolving N,N-dimethyloctadecylamine in the same solvent in a ratio of 1:2 (V/V) to prepare a solution of the polyamide acid octadecylamine salt expressed by Formula (2).

The thus-prepared solution was then developed on a water phase (FIG. 5) comprising pure water at 20° C. to form a monomolecular film on the water surface. After the solvent had been evaporated off, the development area was reduced by moving the floats serving as the partition plates 53 so that the surface pressure was increased to 25 mN/m. The substrate with the upper electrode was gently immersed in the water at a speed of 5 mm/min in the direction vertical to the water surface while the surface pressure was kept at that value and then gently pulled up at a speed of 3 mm/min to form a Y-type accumulated monomolecular film comprising two layers. This process was repeated to form the accumulated monomolecular film comprising 10 layers of polyimide acid octadecylamine salt. The substrate was then immersed in a mixed solution containing acetic anhydride, pyridine and benzene (1:1:3) for 12 hours for the purpose of performing imidation of the polyimide acid octadecylamine salt to form the accumulated polyimide monomolecular film comprising 10 layers (Formula (3)).

An Al strip (thickness, 1000Å) having a width of 1 mm was then formed on the thus-formed accumulated polyimide monomolecular film in such a manner as to intersect the intermediate electrode 24 at right angles by vapor deposition to form the upper electrode 22.

Figure 3:
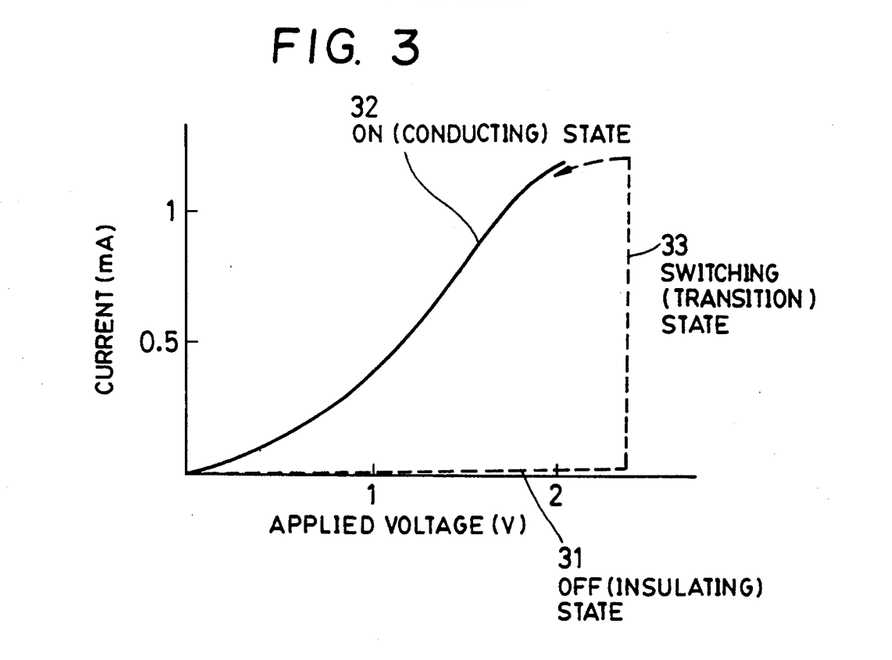
FIG. 3 is a graph showing the VI (voltage/current) characteristics of the element shown in FIG. 2.

A power source 27 for applying a bias was connected between the lower transparent electrode 26 and the upper electrode 22 of the sample formed by the above-described method as shown in FIG. 2, and the current-voltage characteristics (VI characteristics) between the terminals 21 which were respectively provided on the upper electrode 22 and the intermediate electrode 24 were measured by the following method:

It was first confirmed that, when the applied voltage is increased, the switching element of this example shows transition from an off (resistance value, $10^6\Omega$) state 31 (FIG. 3) to an on (resistance value, $10\Omega$) state in a short time (10 nsec or less) at about 2.5V in a dark place, as shown in FIG. 3, even if the dc bias voltage is 0V. It was also confirmed that the off state was reproduced by applying a pulse wave (width, 1 msec) having a peak value of 8 to 10V to the switching element in the on state. After it had been confirmed that the properties peculiar to the MIM element using the microfilm structure are satisfactorily reproduced, the dc bias voltage was set to 4V, and the VI characteristics were measured within the range of 0 to 2V before and after irradiation of light, followed by comparison therebetween. As a result, it was apparent that the element which showed the off state before irradiation (in a dark place) was switched to the on state by the light 29 (white light, 120 $\mu W/cm^2$) applied to the lower side of the substrate. This on state was maintained even if irradiation of light was stopped (again placed in the dark place). In other words, it was found that the MIM element functions as an optical switching element and has memory properties. The on state could also be rapidly removed (returned to the off state) by applying a pulse wave of about 10V. Although the maintenance of memory was measured for about one month, it was confirmed that the memory properties are maintained during this period without any auxiliary means (energy) such as a bias voltage or light being applied.

EXAMPLE 2

Cr was deposited on a glass substrate 28 by vapor deposition to form an under coating layer having a thickness of 300Å, and Au was then vapor-deposited on the under coating layer by the same method to form a strip-shaped under electrode 43 (FIG. 4) having a width of 1 m. An accumulated polyimide monomolecular film comprising 10 layers was then formed on the the substrate by the same method as that employed in Example 1 to form a microfilm structure 23. Al was then vapor-deposited on the thus-formed microfilm structure 23 to provide an upper electrode 42.

Figure 4:
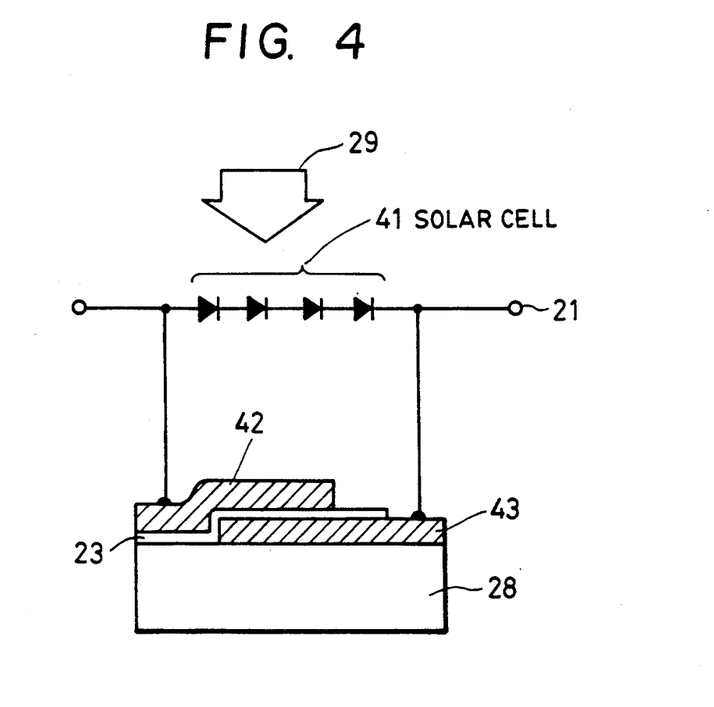
FIG. 4 is a block diagram of an optical switching element constituting another embodiment in which solar cells are used in a photoelectric conversion region.

Lead-out wires serving as terminals 21 were then respectively provided on the two electrodes of the sample of this example, and four solar cells which were respectively formed on Si substrates were connected to the terminals in series to form the circuit shown in FIG. 4.

The VI characteristics of the thus-formed element were measured when light was applied (550 nm, 2 nW cm$^2$). As a result, it was found that the element which showed the off state (resistance, $10^6\Omega$) before irradiation of light maintained the on state (resistance, $10\Omega$) after irradiation even if the element was allowed to stand in a dark place. The on state could also be returned to the off state by applying a pulse voltage (about 10V, 1 $\mu$sec).

Although this example used Si solar cells which were separately produced, the same effect as that obtained by the use of the Si solar cells can be expected from the use of solar cells composed of thin films or sintered films made of amorphous silicon, GaAs, CdS or the like. Solar cells each composed of an organic material may be used so far as one or more such cells connected to each other are capable of generating a voltage (1 to 5V) sufficient to switch the MIM element. If a bias power source is provided outside the element, the solar cells 41 may be replaced by various types of known optical sensors such as a photoavalanche diode, a phototransistor diode and the like.

The solar cells 41 can also be formed on the substrate of the MIM element. The shape of the element of the present invention is not particularly limited.

EXAMPLES 3 TO 7

Samples were formed by the same method as that employed in Example 1 with exception that each of the microfilm structures 23 was formed by the LB method using the organic materials shown in Table 1. As a result of measurement of the VI characteristics of the samples, all the samples exhibited the characteristics of optical switching that were the same as in Example 1.

TABLE 1

| Example | Material of insulating film 12 | Number of layers | Conditions of film formation | Thickness of insulating film 12 (Å) |
|---|---|---|---|---|
| 3 | t-butyl-substituted lutetium diphthalocyanine | 8 | F = 25 mN/m | 180 |
| 4 | $C_{10}H_{21}C\equiv C-C\equiv C-(CH_2)_2COOH$ | 8 | F = 20 mN/m, Polymerization by irradiation of ultraviolet rays after film formation | 140 |
| 5 | SOAZ; | 8 | F = 20 mN/m | 120 |

TABLE 1-continued

| Example | Material of insulating film 12 | Number of layers | Conditions of film formation | Thickness of insulating film 12 (Å) |
|---|---|---|---|---|
| 6 | <br>Copolymer of methacrylic acid and styrene | 10 | N-hexadecyl-dimethylamine was added in film formation (F = 25 mN/m) and then removed by immersing in a solution of n-hexane and acetic acid (50:1 (%)). | 50 |
| 7 | Bacteriolodo pusine | 8 | F = 20 mN/m | — |

Although each of the above-described examples utilizes the LB method as a method of forming the insulating thin films, the film formation method is not limited to the LB method and any other methods which are capable of forming insulating uniform microfilms can be used. Examples of film formation methods include vacuum deposition, electrolytic polymerization, CVD and the like, and wide-ranging materials can thus be used.

With respect to the formation of electrodes, the method of forming electrodes is not limited to vacuum deposition and sputtering methods and any other methods which are capable of forming films on the insulating film can be used, such as described above.

The material and shape of the substrate used in the present invention are not particularly limited.

EFFECT OF THE INVENTION (1) The combination of a switching element having the MIM structure exhibiting an electrical switching phenomenon with a material or element having properties of photoelectric conversion enables the achievement of such optical switching characteristics as a result which has been not achieved so far.

(2) The film formation of the molecular order can be easily realized by forming the "I region" in the MIM element using the LB method. This method exhibits excellent controlling properties and thus shows a high degree of reproducibility of the shape and properties of the switching element, as well as good productivity.

What is claimed is:

1. A switching device comprising:
   (a) an element comprising two electrodes and an organic insulative region interposed between said two electrodes, said element having a memory property and being capable of being switched between different resistance states upon application of a predetermined voltage;
   (b) a photosensitive region having an electrical property which is changed by irradiation of light, said photosensitive region being arranged to change a magnitude of voltage applied to said element; and
   (c) means for applying a biasing voltage to said element and said photosensitive region, said biasing voltage being of such a magnitude as to initiate one of said resistance states in said element having the memory property when light is irradiated on the photosensitive region.

2. A switching device according to claim 1, wherein the conductivity of said photosensitive region is changed by irradiation of light.

3. A switching device according to claim 1, wherein an electromotive force is produced by irradiation of light in said photosensitive region.

4. A switching device according to claim 1, wherein said insulative region is composed of organic thin films and has a laminar structure.

5. A switching device according to claim 4, wherein said laminar structure comprises an LB film.

6. A switching device according to claim 4, wherein a thickness of each of said organic thin film is 5 to 500Å.

7. A switching device according to claim 1, wherein a material composing said insulative region is selected from a group consisting of a compound having $\pi$ electron levels, a polymer compound and a fatty acid.

8. A switching device according to claim 1, wherein said photosensitive region contains amorphous silicon.

9. A switching device according to claim 1, wherein one of said electrodes is transparent.

10. A switching device according to claim 1, wherein said photosensitive region contains material selected from the group comprising Si, Ge, PbS and CdS.

11. A switching device according to claim 1, wherein one of said electrodes is semitransparent.

12. A switching device comprising:
   (a) a first element comprising two electrodes and an organic insulative region interposed therebetween, said first element having a memory property and being capable of being switched between different resistance states upon application of a predetermined voltage;
   (b) a second element comprising two electrodes and a photosensitive region interposed therebetween, said photosensitive region having an electrical property which is changed by irradiation of light, said second element being arranged to change a magnitude of voltage applied to said first element; and
   (c) means for applying a biasing voltage to said first element and said photosensitive region, said biasing voltage being of such a magnitude as to initiate one of said resistance states in said first element having the memory property when light is irradiated on said photosensitive region.

13. A switching device according to claim 8, wherein said region is composed of organic thin films and has a laminar structure.

14. A switching device according to claim 9, wherein said laminar structure comprises an LB film.

15. A switching device according to claim 13, wherein a thickness of each of said organic thin films is 5 to 500Å.

16. A switching device according to claim 12, wherein a conductivity of said photosensitive region is changed by irradiation of light.

17. A switching device according to claim 12, wherein an electromotive force is produced by irradiation of light in said photosensitive region.

18. A switching device according to claim 12, wherein a material constituting said insulative region is selected from the group consisting of a compound having pi electron levels, a polymer compound and a fatty acid.

19. A switching device according to claim 8, wherein said photosensitive region contains amorphous silicon.

20. A switching device according to claim 12, and wherein said photosensitive region contains material selected from the group comprising Si, Ge, PbS and CdS.

21. A switching method comprising the steps of:

(1) providing a switching device comprising:
  (a) a switching element comprising two electrodes and an organic insulative region interposed between the electrodes, the element having a memory property and being capable of being reversibly switched between different resistant states upon application of a predetermined voltage, and
  (b) a photosensitive region having an electrical property which is changed by irradiation of light, wherein the photosensitive region is arranged to change a magnitude of voltage applied to the element;
(2) applying a biasing voltage to the switching element, wherein the biasing voltage is of such a magnitude as to initiate one of said resistance states in the switching element having the memory property when light is irradiated on the photosensitive region; and
(3) irradiating light on the photosensitive region.

* * * * *

UNITED STATES PATENT AND TRADEMARK OFFICE
CERTIFICATE OF CORRECTION

PATENT NO. : 5,170,238

DATED : December 8, 1992

INVENTOR(S) : KUNIHIRO SAKAI ET AL.

It is certified that error appears in the above-identified patent and that said Letters Patent is hereby corrected as shown below:

COLUMN 3

Line 11, "method." should read
        --method, (hereinafter the "LB method")--.

COLUMN 6

Line 64, "below.." should read --below.--.
    Line 65, "(Uning #7059)" should read --(Corning #7059)--.

COLUMN 9

Line 45, "the" (second occurrence) should be deleted.

COLUMN 12

Line 30, "film" should read --films--.

UNITED STATES PATENT AND TRADEMARK OFFICE
CERTIFICATE OF CORRECTION

PATENT NO. : 5,170,238
DATED : December 8, 1992
INVENTOR(S) : KUNIHIRO SAKAI ET AL.

It is certified that error appears in the above-identified patent and that said Letters Patent is hereby corrected as shown below:

COLUMN 13

Line 15, "claim 8," should read --claim 12,--.
Line 17, "and" should be deleted.

Signed and Sealed this

Twelfth Day of April, 1994

Attest:

BRUCE LEHMAN

*Attesting Officer*  *Commissioner of Patents and Trademarks*